United States Patent
Song

(10) Patent No.: US 6,797,583 B2
(45) Date of Patent: Sep. 28, 2004

(54) METHOD OF MANUFACTURING CAPACITOR IN SEMICONDUCTOR DEVICES

(75) Inventor: Chang Rock Song, Ichon-Shi (KR)

(73) Assignee: Hynix Semiconductor INC, Ichon-shi (KR)

( * ) Notice: Subject to any disclaimer, the term of this patent is extended or adjusted under 35 U.S.C. 154(b) by 0 days.

(21) Appl. No.: 09/982,023

(22) Filed: Oct. 19, 2001

(65) Prior Publication Data

US 2002/0048878 A1 Apr. 25, 2002

(30) Foreign Application Priority Data

Oct. 20, 2000 (KR) .......................................... 2000-62025

(51) Int. Cl.[7] .............................................. H01L 21/28
(52) U.S. Cl. ....................................... 438/396; 438/240
(58) Field of Search ................................. 438/240, 253, 438/396, FOR 212, FOR 220

(56) References Cited

U.S. PATENT DOCUMENTS

| | | | | |
|---|---|---|---|---|
| 6,103,400 A | * | 8/2000 | Yamada et al. | 428/627 |
| 6,143,605 A | * | 11/2000 | Lou | 438/255 |
| 6,159,868 A | * | 12/2000 | Hieda et al. | 438/778 |
| 6,265,262 B1 | * | 7/2001 | Okuno et al. | 257/306 |
| 6,284,655 B1 | * | 9/2001 | Marsh | 438/681 |
| 6,287,910 B2 | * | 9/2001 | Lee et al. | 438/240 |
| 6,294,420 B1 | * | 9/2001 | Tsu et al. | 438/239 |
| 6,338,996 B1 | * | 1/2002 | Iizuka | 438/240 |
| 6,348,709 B1 | * | 2/2002 | Graettinger et al. | 257/311 |
| 6,372,598 B2 | * | 4/2002 | Kang et al. | 438/399 |
| 6,486,022 B2 | * | 11/2002 | Lee | 438/240 |
| 2002/0022334 A1 | * | 2/2002 | Yang et al. | 438/396 |
| 2002/0037624 A1 | * | 3/2002 | Mori et al. | 438/396 |
| 2002/0145845 A1 | * | 10/2002 | Hunt et al. | 361/303 |
| 2003/0025146 A1 | * | 2/2003 | Narwankar et al. | 257/310 |

* cited by examiner

Primary Examiner—George Fourson
(74) Attorney, Agent, or Firm—Jacobson Holman PLLC

(57) ABSTRACT

A method of manufacturing a capacitor in semiconductor devices, the method comprising forming a silicon oxide film on a surface of a silicon substrate; forming a nitride film on said silicon oxide film; forming a contact hole; depositing a doped polysilicon layer; performing an etch-back process to remove a portion of said doped polysilicon layer; forming an ohmic contact layer over said doped polysilicon layer in said contact hole; forming an anti-diffusion film on said ohmic contact layer; forming a silicate glass film; forming a concave hole by etching a portion of said silicate glass film; forming a Ruthenium lower electrode on said internal wall of said concave hole; forming a BST dielectric film on said first Ruthenium electrode; crystallizing said BST dielectric film; forming an upper electrode on said BST dielectric film, thereby forming a capacitor; and performing a thermal treatment to stabilize said capacitor.

15 Claims, 6 Drawing Sheets

METHOD OF MANUFACTURING CAPACITOR IN SEMICONDUCTOR DEVICES

CLAIM FOR PRIORITY

This application claims the benefit of the earlier filing date of Korean Patent Application No. 00-62025, filed Oct. 20, 2000, which is hereby incorporated by reference in its entirety.

FIELD OF THE INVENTION

The invention relates generally to a method of manufacturing a capacitor in semiconductor devices. More particularly, the invention relates to a method of manufacturing semiconductor devices that prevents defective Ru/BST/Ru capacitors by depositing a Ru lower electrode by means of a chemical vapor deposition (CVD) method, and then stabilizing the surface of the Ru lower electrode by a given thermal process. The invention can be used in a process of manufacturing a capacitor in a DRAM device having the integration degree of over 1 Gbit.

BACKGROUND OF THE INVENTION

The current trend includes increasingly utilizing $Ta_2O_5$ or BST as a dielectric thin film for use in a $SiO_2/Si_3N_4/SiO_2$ stack structure in a DRAM. It is believed that in the near future, as a design rule, BST will be the most promising dielectric thin film in a DRAM over 1 Gbit. In a high quality actual device, the BST dielectric thin film can be formed on a patterned substrate by means of a chemical vapor deposition method. When BST is used as a dielectric thin film, its applications typically include a concave type Ru/BST/Ru capacitor or a stack type Pt/BST/Pt capacitor. When Pt is used as an electrode material, its capacitor characteristics are very stable due to its stable interface characteristic with BST, without regard to the its formation method or a post-process. On the other hand, when Ru is used as an electrode material, its capacitor characteristics become unstable because it degrades the quality of BST when BST is deposited. This is believed to be due to the easily oxidized characteristic of Ru and because of its low catalyst characteristic as compared to Pt. Thus, Pt allows very good BST film quality when BST is deposited by means of a chemical vapor deposition method because Pt contains a significant number of activated oxygen atoms due to its catalytic characteristic. However, Ru degrades the BST film quality because Ru tends to form a $RuO_2$ oxidization phase, instead of activated oxygen atoms, without silver catalyst characteristic.

Furthermore, Ru must be processed at a very low temperature (250~270° C.) in order to deposit Ru by means of the chemical vapor deposition method to prevent creation of $RuO_2$. Due to these characteristics, Ru affects a BST thin film or an underlying anti-diffusion film because it contains a significant amount of carbon and oxygen during a subsequent process. Even with a flat structural layout, it is difficult to obtain good BST deposition characteristics on Ru by means of the chemical vapor deposition method. These hindrances have obstructed and delayed development of a concave type Ru/BST/Ru capacitor. It is believed that attempts have been made to perform a rapid thermal process (RTP) under nitrogen or argon atmosphere in order to obtain a good characteristic Ru film. Therefore, there is a need for a process to change the surface characteristics of Ru in order to improve an interface characteristic of BST/Ru for flat or curved surfaces.

SUMMARY OF THE INVENTION

It is therefore an object of the present invention to provide a manufacturing method that prevents defective Ru/BST/Ru capacitors in semiconductor devices by depositing a Ru lower electrode by means of the chemical vapor deposition method and then stabilizing the surface of the Ru lower electrode by a given thermal process.

According to the present invention, a BST/Ru interface that is characterized by low leakage current and dielectric constant can be obtained to improve the reliability of a capacitor.

In order to accomplish the above objects, a method of manufacturing a capacitor in semiconductor devices according to the present invention is characterized in that it comprises forming a silicon oxide film on a surface of a silicon substrate; forming a nitride film on said silicon oxide film; forming a contact hole by sequentially etching a portion of said nitride film and said silicon oxide film; depositing a doped polysilicon layer over the entire surface of said silicon substrate, said doped polysilicon layer filling said contact hole; performing an etch-back process to remove a portion of said doped polysilicon layer, said etch-back process leaving said doped polysilicon layer in said contact hole; forming an ohmic contact layer over said doped polysilicon layer in said contact hole; forming an anti-diffusion film on said ohmic contact layer; forming a silicate glass film over the entire surface of said silicon substrate including said anti-diffusion film; forming a concave hole by etching a portion of said silicate glass film, said concave hole having an internal wall; forming a Ruthenium lower electrode on said internal wall of said concave hole; forming a BST dielectric film on said first Ruthenium electrode, said forming said BST dielectric sequentially including performing a $NH_3$-plasma process, performing a $N_2O$-plasma process, and depositing BST; crystallizing said BST dielectric film, said crystallizing including performing a rapid thermal process; forming an upper electrode on said BST dielectric film, said BST dielectric film and said first and second Ruthenium electrodes forming a capacitor; and performing a thermal treatment to stabilize said capacitor.

BRIEF DESCRIPTIONS OF THE DRAWINGS

The aforementioned aspects and other features of the present invention will be explained in the following description, taken in conjunction with the accompanying drawings, wherein.

DETAILED DESCRIPTION OF THE PREFERRED EMBODIMENT

Figure 1:
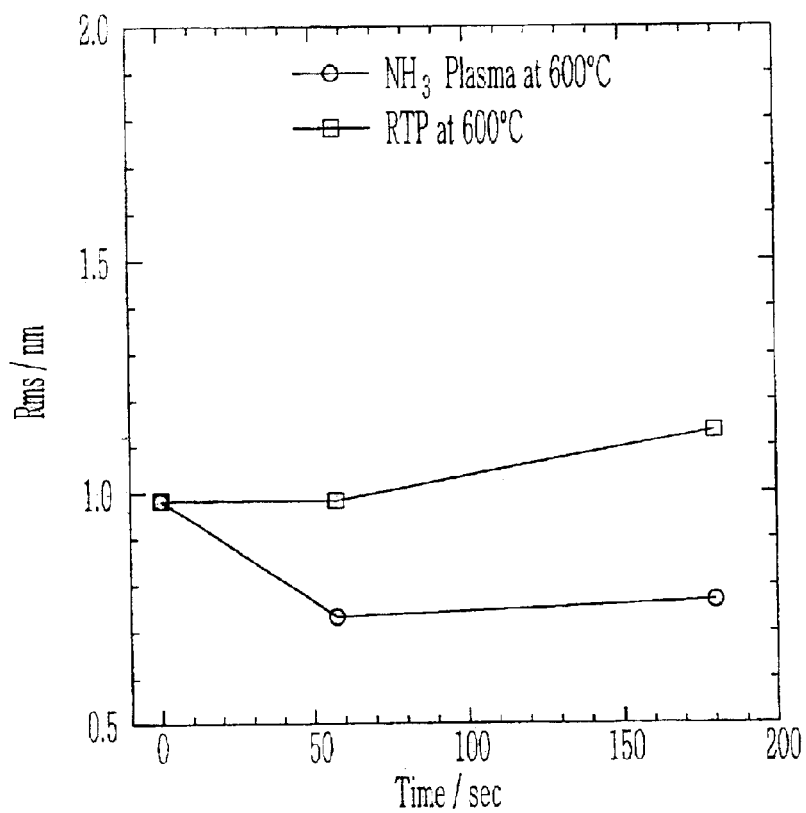
FIG. 1 shows a result of comparing the surface roughness for the case that a Ru film deposited by a DC-sputtering method and smoothed by a rapid thermal process and a $NH_3$-plasma process at 600° C.

The present invention will now be described in detail by way of a preferred embodiment with reference to the accompanying drawings, in which like reference numerals are used to identify the same or similar parts.

In order to overcome conventional problems with Ru film, post-processing of a Ru film include the following conditions: 1) smoothing of a consistency of a thin film, 2) reduction in the surface roughness and 3) adsorption of activated oxygen on the surface of the Ru film. To accomplish this, the present invention forms a Ru lower electrode on a patterned wafer and then performs a two-step plasma treatment. The two-step plasma treatment includes performing a $NH_3$-plasma process to reduce the surface roughness, and performing a $N_2O$-plasma process to adsorb the activated oxygen.

FIG. 1 shows a comparison of the surface roughness a Ru film deposited by a DC-sputtering method and subjected to 1) a rapid thermal process at the temperature of 600° C. under nitrogen atmosphere, and 2) a $NH_3$-plasma process at the temperature of 600° C. It can be seen from FIG. 1 that the root-mean-square (Rms) value representing the surface for the $NH_3$-plasma process is less than the rapid thermal process (RTP). The Rms value for the case of the $NH_3$-plasma process is less than the case of the rapid thermal process (RTP) even with the Ru film being deposited by the DC-sputtering method. Therefore, the $NH_3$-plasma process improves the consistency of the Ru film and also reduces its surface roughness.

Figure 2:
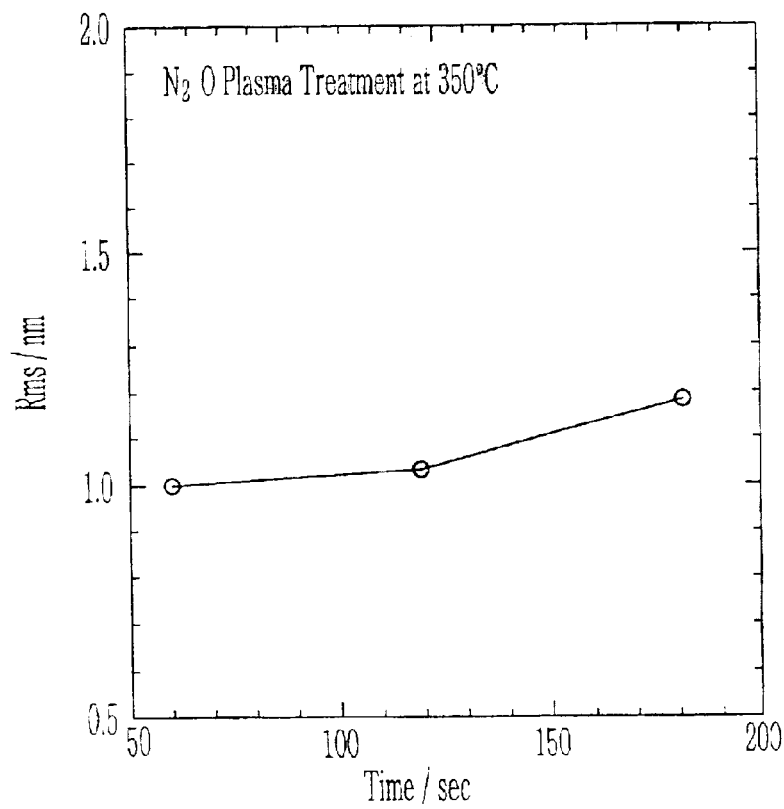
FIG. 2 shows the surface roughness of the Ru film for the case that the Ru film is smoothed by a $N_2O$-plasma process at the temperature of 350° C.
Figure 3:
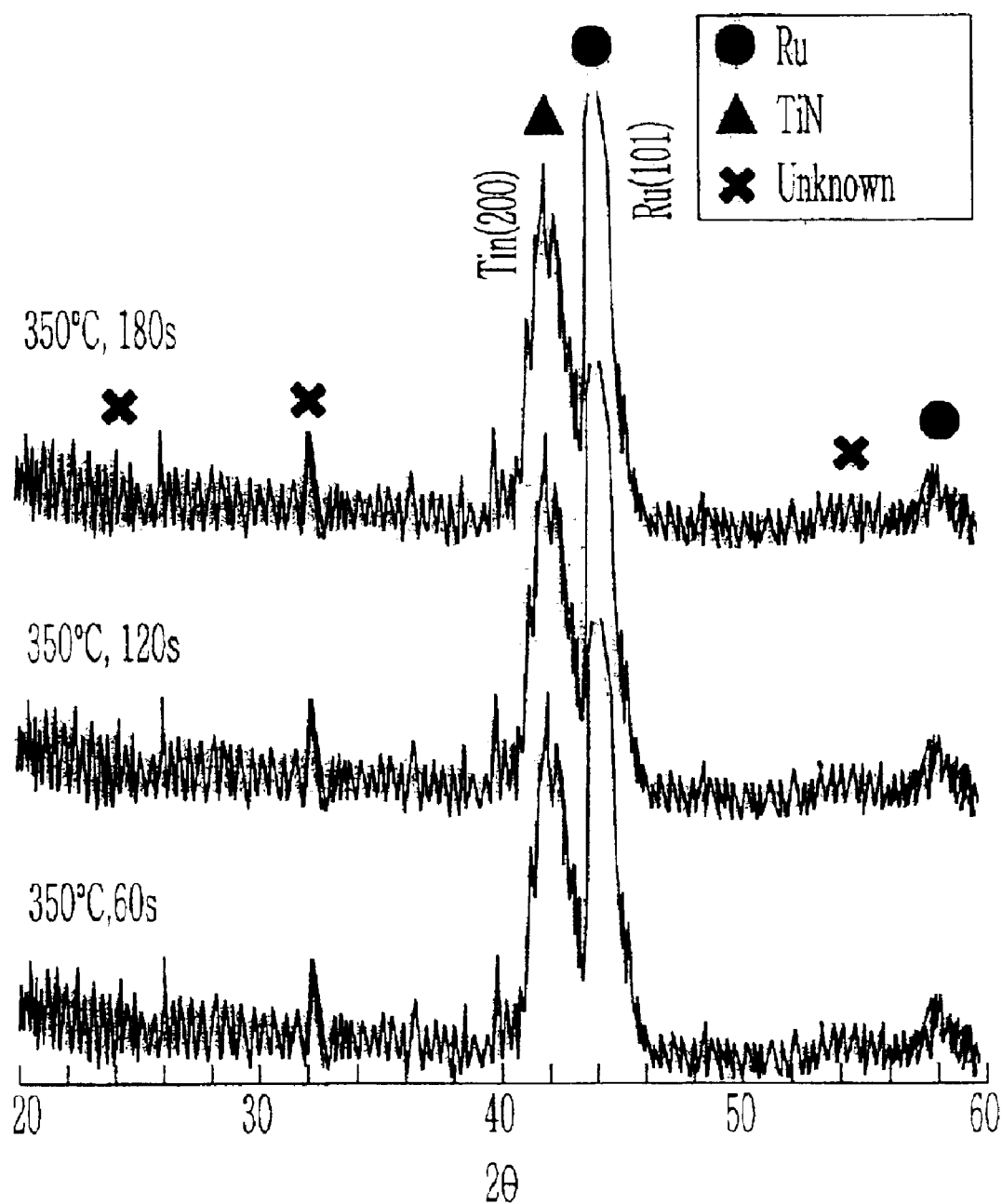
FIG. 3 shows a result of XRD of the surface of the Ru film.
Figure 4:
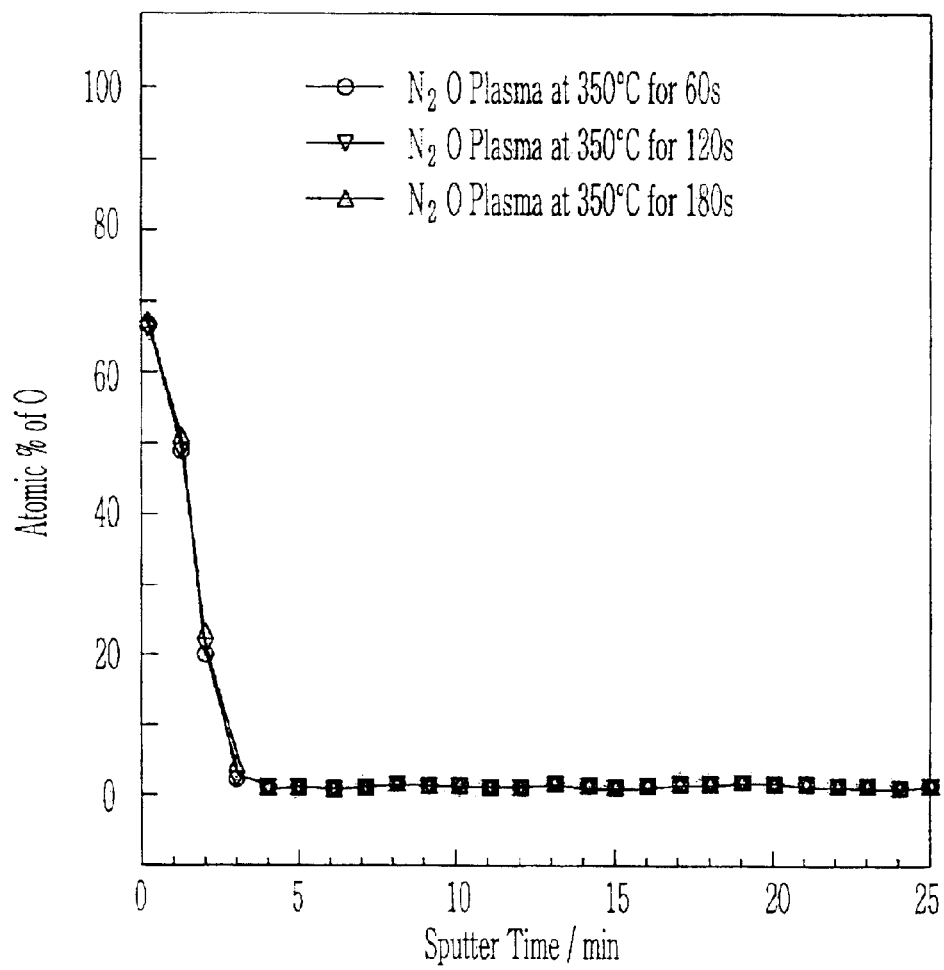
FIG. 4 represents a diffusion curve of oxygen atoms.

FIG. 2 shows the surface roughness of the Ru film that has been subjected to a $N_2O$-plasma process at a temperature of 350° C. FIG. 3 shows a result of XRD of the Ru film surface. And, FIG. 4 represents a diffusion curve of oxygen atoms. As can be seen from FIG. 2, if the $N_2O$-plasma process is applied, the surface roughness of the Ru film is slightly increased. However, as shown in FIG. 3, a $RuO_2$ phase that prevents BST from being deposited by means of a chemical vapor deposition method is not generated so that a significant amount of oxygen can be adsorbed on the surface of Ru film, as can be seen from FIG. 4. The activated oxygen atoms improve the quality of a BST film that is deposited on the surface of the Ru film when the BST is deposited by means of a chemical vapor deposition method. This results in a good BST/Ru interface characteristic.

Figure 5:
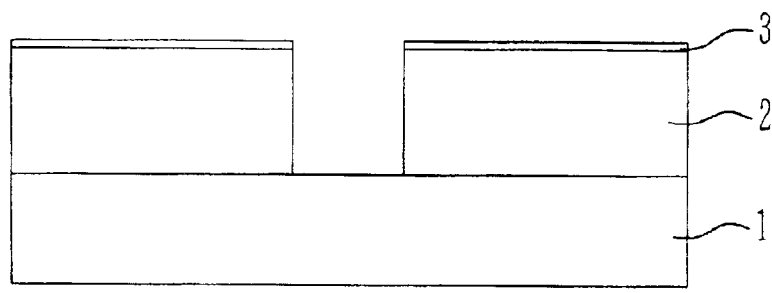
FIG. 5 shows a silicon oxide film formed on a silicon substrate in which semiconductor circuits are formed.

Referring to FIG. 5, a silicon oxide film 2 defining an interlayer insulating layer is formed on the entire surface of a silicon substrate 1 in which semiconductor circuits are formed. A nitride film 3, having a high etch selectivity to the silicon oxide film 2 is formed on the silicon oxide film 2, and has a thickness of about 300~1000 Å. Next, a contact hole is formed for connecting the underlying substrate 1 and a capacitor by sequentially etching a portion of the nitride film 3 and the silicon oxide film 2.

Figure 6:
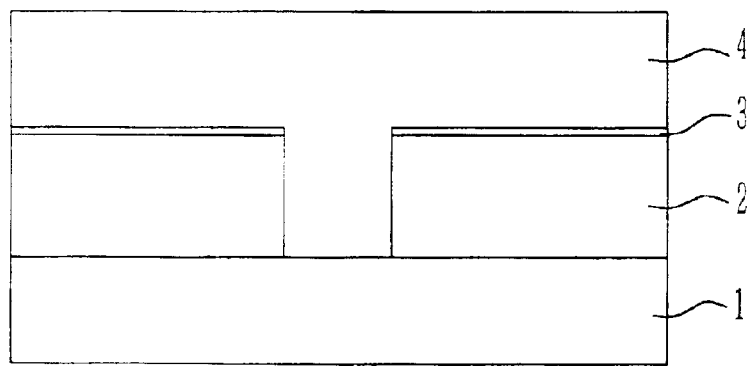
FIG. 6 shows a doped polysilicon layer deposited on the entire surface of the silicon substrate including a contact hole in order to fill the contact hole.

Referring to FIG. 6, a doped polysilicon layer 4 is deposited over the entire surface of substrate 1 and fills the contact hole.

The doped polysilicon layer 4 deposited on substrate 1 has a thickness of about 700~3000 Å and is deposited by means of a chemical vapor deposition method.

Figure 7:
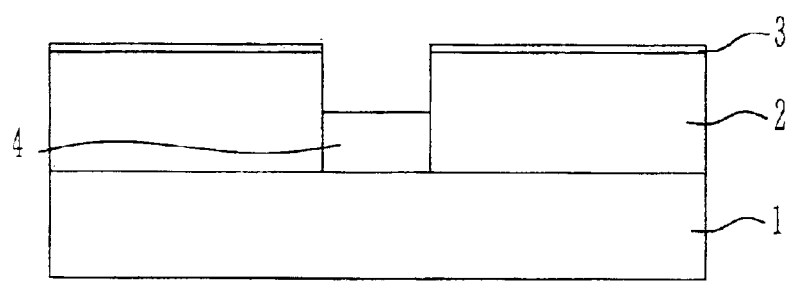
FIG. 7 shows the remaining doped polysilicon layer within the contact hole after an etch-back process is performed to remove a portion of the doped polysilicon layer.

Referring to FIG. 7, in order to remove a portion of the doped polysilicon layer 4, an etch-back process is performed, whereby a portion of the doped polysilicon layer 4 remains in the contact hole.

The doped polysilicon layer 4 remaining in the contact hole is formed by etching the doped polysilicon 4 to a depth of about 200~1500 Å from the top of the contact hole.

Figure 8:
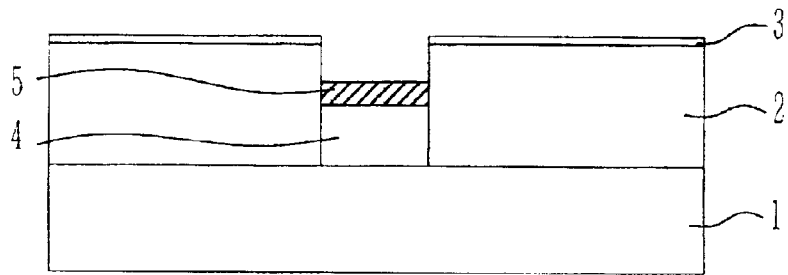
FIG. 8 shows an ohmic contact layer formed on the doped polysilicon layer remaining within the contact hole.

Referring to FIG. 8, an ohmic contact layer 5 is formed on the doped polysilicon layer 4 remaining within the contact hole.

The ohmic contact layer 5 formed on doped polysilicon layer 4 is formed by first depositing Ti or Co to a thickness of about 100~500 Å over the entire surface of the silicon substrate 1, including the doped polysilicon layer 4 remaining within the contact hole. Next, a thermal process is performed to form titanium silicide or cobalt silicide on the doped polysilicon layer 4 remaining within the contact hole. Finally, the remaining Ti or Co is removed.

Figure 9:
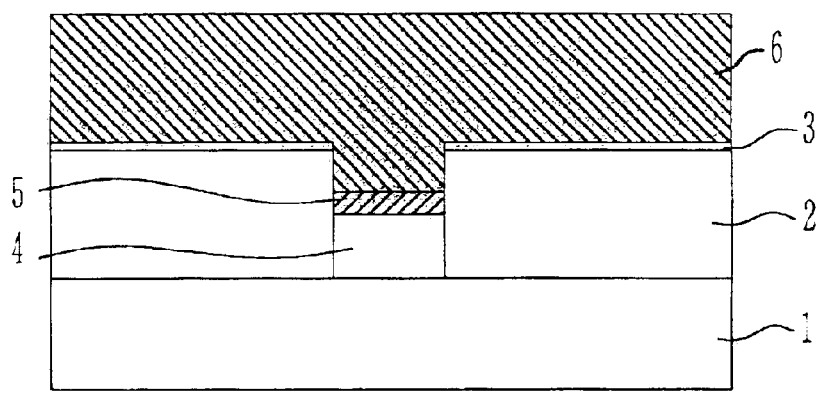
FIG. 9 shows an anti-diffusion film formed by depositing on the resulting surface TiN or TiAlN.
Figure 10:
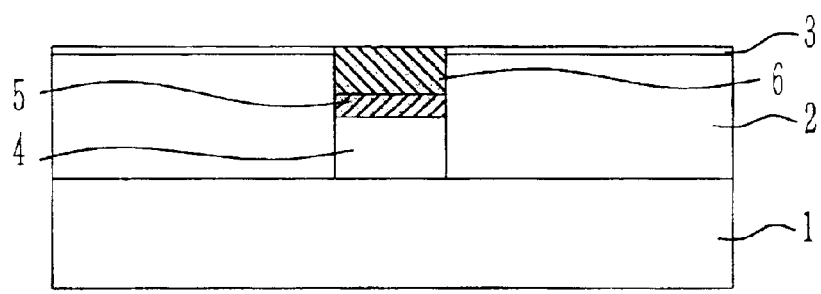
FIG. 10 shows removing the deposited TiN or TiAlN, except in the region of the contact hole by means of a chemical mechanical polishing method.

Referring to FIG. 9, an anti-diffusion film 6 is formed by depositing on the resulting surface TiN or TiAlN to a thickness of about 700~3000 Å by means of a physical vapor deposition method or a chemical vapor deposition method. Next, as shown in FIG. 10, the deposited TiN or the deposited TiAlN is removed from all areas, except within the contact hole, by means of a chemical mechanical polishing method.

Figure 11:
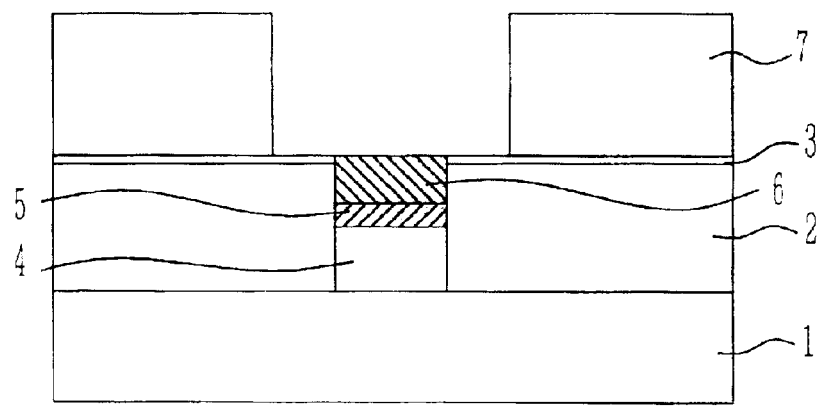
FIG. 11 shows a silicate glass film formed by depositing on the entire surface of the silicon substrate.

Referring to FIG. 11, a silicate glass film 7 having a thickness of about 2000~15000 Å is formed by depositing USG or PSG over the entire surface of the silicon substrate 1, including the anti-diffusion film 6. Next, a concave hole is formed for a capacitor by etching a portion of the silicate glass film 7.

Figure 12:
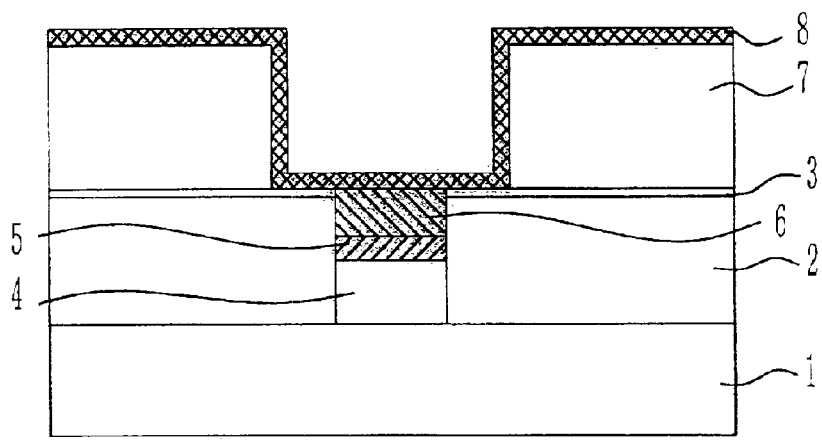
FIG. 12 shows a Ru lower electrode formed by depositing on the entire surface of the silicon substrate.
Figure 13:
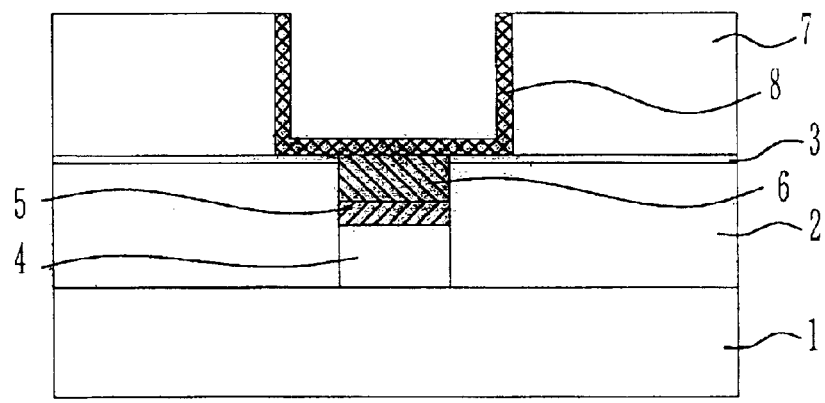
FIG. 13 shows leaving the deposited Ru on the internal wall of the concave hole by means of a chemical mechanical polishing method or etch-back process.

Referring to FIG. 12, a Ru lower electrode 8 is formed by depositing Ru having a thickness of about 100~500 Å on the entire surface by means of a sputtering method or a chemical vapor deposition method. Next, as shown in FIG. 13, the deposited Ru is removed from all surfaces except an internal wall of the concave hole by means of a chemical mechanical polishing method or an etch-back process.

Figure 14:
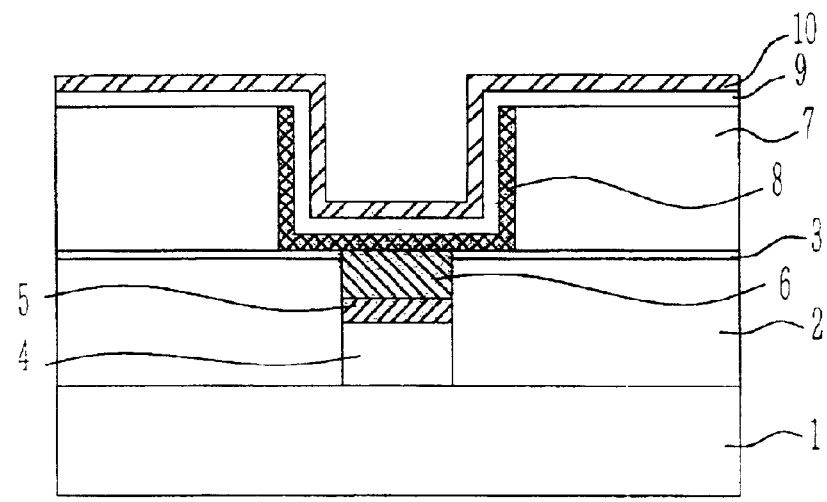
FIG. 14 shows a BST dielectric film formed on the Ru lower electrode.

Referring to FIG. 14, a BST dielectric film 9 is formed on the Ru lower electrode 8 by sequentially performing a $NH_3$-plasma process and a $N_2O$-plasma process, and then depositing BST having a thickness of about 150~500 Å by means of a chemical vapor deposition method. The BST dielectric film 9 is crystallized by performing a rapid thermal process (RTP). An upper electrode 10 is formed on the BST dielectric film 9, thereby forming a capacitor. Thereafter, a thermal treatment is performed to stabilize the capacitor structure.

Preferably, the $NH_3$-plasma process is performed under the following conditions: power is about 100~500 W, pressure is about 0.5~2.0 Torr, flow rate of $NH_3$ is about 200~2000 sccm and temperature is about 350~700° C.

Preferably, the $N_2O$-plasma process is performed under the following conditions: power is about 100~500 W, pressure is about 0.5~2.0 Torr, flow rate of N₂O is about 200~2000 sccm and temperature is about 350~700° C.

Preferably, the rapid thermal process is performed at a temperature of about 500~750° C. for about 10~180 seconds using a mixture gas of oxygen and nitrogen or a mixture gas of oxygen and argon.

Preferably, the thermal treatment is performed at a temperature of about 400~800° C. for about 1~130 minutes using a mixture gas of oxygen and nitrogen or a mixture gas of oxygen and argon.

The upper electrode 10 is formed on the BST dielectric film 9 by depositing Ru, Ir or Pt to thickness of about 150~500 Å by means of a sputtering method or a chemical vapor deposition method.

As can be understood from the above description of the present invention, the present invention can not only improve the quality of a BST dielectric film but can also increase the efficiency of the equipment by sequentially performing a NH₃-plasma process and a N₂O-plasma process, when BST is deposited by means of a chemical vapor deposition method.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a capacitor in semiconductor devices, the method comprising:

forming a silicon oxide film on a surface of a silicon substrate;

forming a nitride film on said silicon oxide film;

forming a contact hole by sequentially etching a portion of said nitride film and said silicon oxide film;

depositing a doped polysilicon layer over the entire surface of said silicon substrate, said doped polysilicon layer filling said contact hole;

performing an etch-back process to remove a portion of said doped polysilicon layer, said etch-back process leaving said doped polysilicon layer in said contact hole;

forming an ohmic contact layer over said doped polysilicon layer in said contact hole;

forming an anti-diffusion film on said ohmic contact layer;

forming a silicate glass film over the entire surface of said silicon substrate including said anti-diffusion film;

forming a concave hole by etching a portion of said silicate glass film, said concave hole having an internal wall;

forming a Ruthenium lower electrode on said internal wall of said concave hole;

performing a NH₃-plasma process and a N₂O-plasma process sequentially on said Ruthenium lower electrode;

forming a BST dielectric film on said Ruthenium lower electrode which had undergone said NH₃-plasma process and said N₂O-plasma process;

crystallizing said BST dielectric film, said crystallizing including performing a rapid thermal process;

forming an upper electrode on said BST dielectric film, said BST dielectric film, said lower Ruthenium electrode and said upper electrode forming said capacitor; and performing a thermal treatment to stabilize said capacitor.

2. The method according to claim 1, wherein said nitride film comprises a thickness of about 300~1000 Å.

3. The method according to claim 1, wherein said depositing said doped polysilicon layer comprises chemical vapor deposition and said doped polysilicon layer comprises a thickness of about 700~3000 Å.

4. The method according to claim 1, wherein said performing said etch-back process etches said doped polysilicon layer to a depth of about 200~1500 Å into said contact hole.

5. The method according to claim 1, wherein said forming said ohmic contact layer comprises depositing at least one of Titanium and Cobalt having a thickness of about 100~500 Å over the entire surface of said silicon substrate, including said doped polysilicon layer remaining within said contact hole, performing a thermal process to form titanium silicide and cobalt silicide on said doped polysilicon layer remaining within said contact hole, and then removing the remaining at least one of Titanium and Cobalt.

6. The method according to claim 1, wherein said forming said anti-diffusion film comprises depositing at least one of TiN and TiAlN having a thickness of about 700~3000 Å over the entire surface of said silicon substrate, and then removing the at least one of said TiN and the TiAlN except from said contact hole, the depositing at least one of TiN and TiAlN including at least one of a physical vapor deposition method and a chemical vapor deposition method, and the removing at least one of TiN and TiAlN including a chemical mechanical polishing method.

7. The method according to claim 1, wherein said forming said silicate glass film comprises depositing at least one of USG and PSG having a thickness of about 2000~15000 Å.

8. The method according to claim 1, wherein said forming said Ruthenium lower electrode comprises depositing Ruthenium having a thickness of about 100~500 Å over the entire surface of said silicon substrate, and then removing the Ruthenium, except from said internal wall of said concave hole, said depositing Ruthenium including at least one of a sputtering method and a chemical vapor deposition method, and said removing the Ruthenium including at least one of a chemical mechanical polishing method and an etch-back process.

9. The method according to claim 1, wherein said performing said NH₃-plasma process comprises a set of conditions including power that is about 100~500 W, pressure that is about 0.5~2.0 Torr, flow rate of NH₃ that is about 200~2000 sccm, and temperature that is about 350~700° C.

10. The method according to claim 1, wherein said performing said N₂O-plasma process comprises a set of conditions including power that is about 100~500 W, pressure that is about 0.5~2.0 Torr, flow rate of N₂O that is about 200~2000 sccm, and temperature that is about 350~700° C.

11. The method according to claim 1, wherein said depositing said BST dielectric film comprises a chemical vapor deposition method and said BST dielectric film comprises a thickness of about 150~500 Å.

12. The method according to claim 1, wherein said performing said rapid thermal process comprises at least one of a mixture gas of oxygen and nitrogen and a mixture gas of oxygen and argon at a temperature of about 500~750° C. for about 10~180 seconds.

13. The method according to claim 1, wherein said forming said upper electrode comprises depositing at least one of Ruthenium, Iridium, and Platinum having a thickness of about 150~500 Å, the depositing at least one of Ruthenium, Iridium, and Platinum including at least one of a sputtering method and a chemical vapor deposition method.

14. The method according to claim 1, wherein said performing said thermal treatment comprises at least one of a mixture gas of oxygen and nitrogen and a mixture gas of oxygen and argon at a temperature of about 400~800° C. for about 1~130 minutes.

15. The method according to claim 1, wherein the silicon oxide film comprises an interlayer insulating layer.

* * * * *